(12) United States Patent
Harrell et al.

(10) Patent No.: US 11,101,263 B2
(45) Date of Patent: Aug. 24, 2021

(54) RESISTOR WITH EXPONENTIAL-WEIGHTED TRIM

(71) Applicant: TEXAS INSTRUMENTS INCORPORATED, Dallas, TX (US)

(72) Inventors: Steve Edward Harrell, Corinth, TX (US); Keith Eric Sanborn, Tucson, AZ (US); Wai Lee, Dallas, TX (US); Erika Lynn Mazotti, San Martin, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/547,615

(22) Filed: Aug. 22, 2019

(65) Prior Publication Data

US 2020/0075573 A1  Mar. 5, 2020

Related U.S. Application Data

(60) Provisional application No. 62/725,980, filed on Aug. 31, 2018, provisional application No. 62/725,724, filed on Aug. 31, 2018.

(51) Int. Cl.
| | |
|---|---|
| *H01L 27/00* | (2006.01) |
| *H01L 23/525* | (2006.01) |
| *H01L 27/08* | (2006.01) |
| *H01L 49/02* | (2006.01) |

(52) U.S. Cl.
CPC .......... *H01L 27/00* (2013.01); *H01L 23/5258* (2013.01); *H01L 27/0802* (2013.01); *H01L 28/20* (2013.01)

(58) Field of Classification Search
None
See application file for complete search history.

(56) References Cited

U.S. PATENT DOCUMENTS

| | | |
|---|---|---|
| 4,201,970 A | 5/1980 | Onyshkevych |
| 5,319,345 A | 6/1994 | Abe et al. |
| 5,493,148 A | 2/1996 | Ohata et al. |
| 2009/0039955 A1 | 2/2009 | Hosoya |
| 2019/0003900 A1 | 1/2019 | Green et al. |

OTHER PUBLICATIONS

PCT Search Report for Application No. 1PCT/US 2019-047918, dated Dec. 5, 2019.

*Primary Examiner* — Reema Patel
(74) *Attorney, Agent, or Firm* — Andrew R. Ralston; Charles A. Brill; Frank D. Cimino

(57) ABSTRACT

An electronic device, e.g. a trimmable resistor, includes a plurality of fused resistors, each fused resistor including one or more doped resistive regions formed in a semiconductor substrate. The doped resistive regions may be thermistors. Each fused resistor further includes a corresponding one of a plurality of fusible links. A first terminal of each of the fused resistors is connected to a first terminal of the corresponding fusible link. First and second interconnection buses are located over the substrate, with the first interconnection bus connecting to a second terminal of each of the fused resistors, and the second interconnection bus connecting to a second terminal of each of the fusible links. The plurality of fused resistors have resistance values that form an exponential progression.

26 Claims, 8 Drawing Sheets

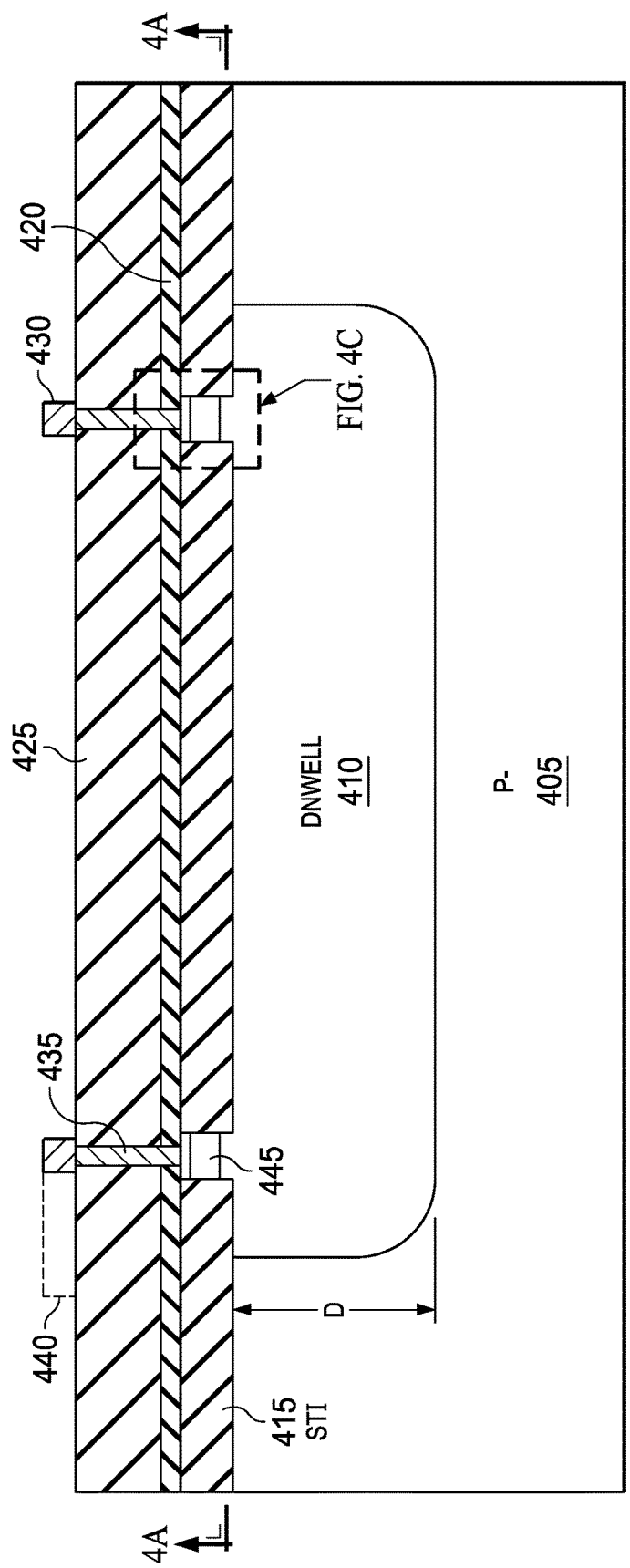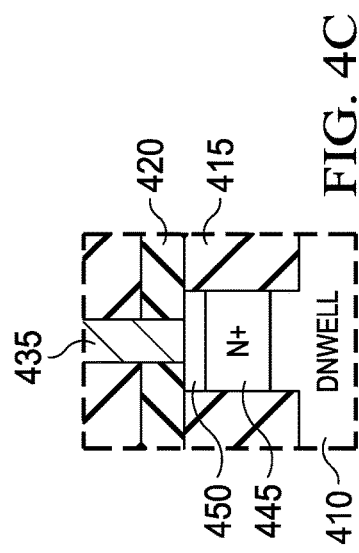
FIG. 4B
FIG. 4C

RESISTOR WITH EXPONENTIAL-WEIGHTED TRIM

CROSS REFERENCE TO RELATED APPLICATIONS

This non-provisional application claims priority based upon U.S. provisional patent applications Nos. 62/725,724 and 62/725,980, filed Aug. 31, 2018, which are hereby incorporated by reference in their entireties.

FIELD

This disclosure relates to the field of semiconductor devices, and more particularly, but not exclusively, to resistors with trimming capability.

BACKGROUND

Precision resistors play an important role in various electronic devices and assemblies. Such resistors may be economically formed on a semiconductor substrate, or wafer, but such resistors formed in this manner may have a relatively large distribution of resistance values due to factors such as process nonuniformity across the wafer. This distribution may require sorting the resistors by resistance value to provide resistors of known precision in sensitive applications. In some cases resistors with a large deviation from a target resistance may be scrapped.

SUMMARY

The inventors disclose various methods and devices that may be beneficially applied to manufacturing integrated circuits (ICs) including adjustable resistors, e.g. programmable thermistor networks. While such embodiments may be expected to provide improvements in achieving a target resistance in a population of adjustable resistors, no particular result is a requirement of the described invention(s) unless explicitly recited in a particular claim.

The present disclosure introduces an electronic device, e.g. a trimmable resistor. The device a plurality of fused resistors, each fused resistor including one or more doped resistive regions formed in a semiconductor substrate. The doped resistive regions may be thermistors. Each fused resistor further includes a corresponding one of a plurality of fusible links. A first terminal of each of the fused resistors is connected to a first terminal of the corresponding fusible link. First and second interconnection buses are located over the substrate, with the first interconnection bus connecting to a second terminal of each of the fused resistors, and the second interconnection bus connecting to a second terminal of each of the fusible links. The plurality of fused resistors have resistance values that form an exponential progression.

Another example provides a method e.g. of forming an integrated circuit. The method includes forming a plurality of unit resistors in a semiconductor substrate. A first subset of unit resistors is connected in series thereby forming a first resistor. A second subset of unit resistors is connected in parallel thereby forming a second resistor. A first terminal of the first resistor and a first terminal of the second resistor are connected to a first connection bus, and a second terminal of the first resistor and a second terminal of the second resistor are connected to a second connection bus.

Another example provides a method, e.g. of forming an electronic device. A plurality of unit resistors, and first and second interconnection buses are formed over a semiconductor substrate. A plurality of composite resistors is connected between the first and second interconnection buses, each composite resistor of the plurality of composite resistors including a subset of the plurality of unit resistors connected in parallel or a subset of the plurality of unit resistors connected in series. A corresponding one of a plurality of fusible links is connected between the second interconnection bus and each of a corresponding one of the composite resistors. A unit resistor is connected directly to the first interconnection bus and to the second interconnection bus via one of the plurality of fusible links.

Yet another example provides an electronic device, e.g. a trimmable resistor. The device includes a first plurality of unit resistors, and a second plurality of unit resistors, each unit resistor formed in or over a semiconductor substrate and having a same nominal resistance value. The first plurality of unit resistors are interconnected between a first node and a second node, and a first unit resistor and a second unit resistor of the first plurality of unit resistors are connected at a third node. The second plurality of unit resistors are each connected between the second node and the third node. The first and second pluralities of unit resistors are arranged in a two-dimensional array, with the first plurality of unit resistors located between a first subset of the second plurality of unit resistors and a second subset of the second plurality of unit resistors.

BRIEF DESCRIPTION OF THE VIEWS OF THE DRAWINGS

FIGS. 4A-4C illustrate physical features of a unit resistor, e.g. a thermistor, implemented in a semiconductor substrate;

DETAILED DESCRIPTION

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

While various examples of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

Figure 1A:
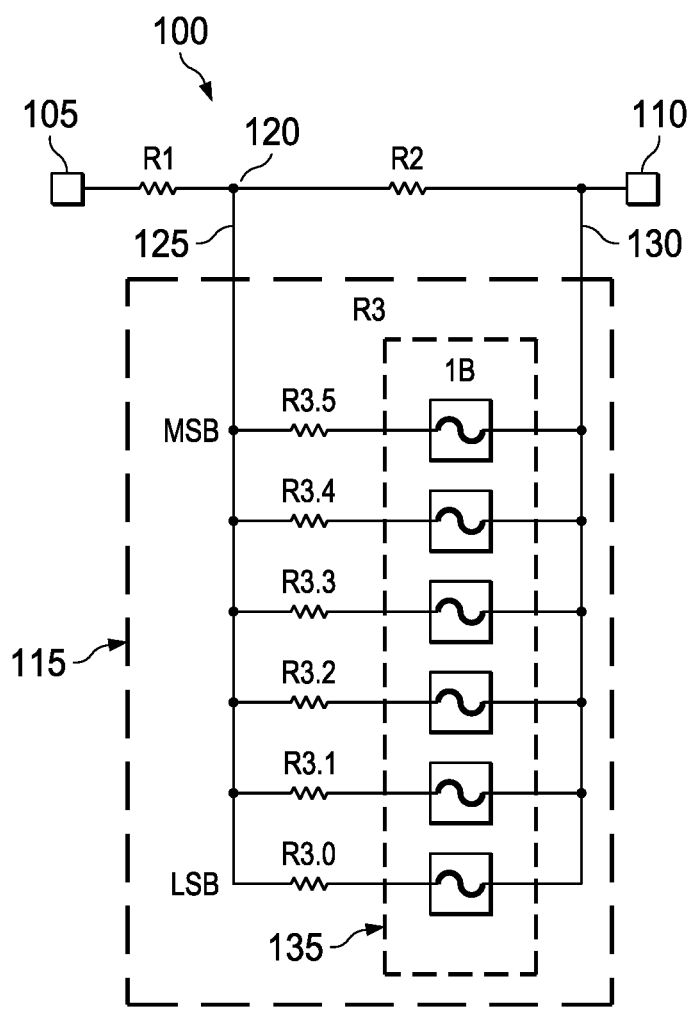
FIGS. 1A and 1B illustrate aspects of a schematic representation of an adjustable resistor network according to various examples consistent with the principles of the disclosure.
Figure 1B:
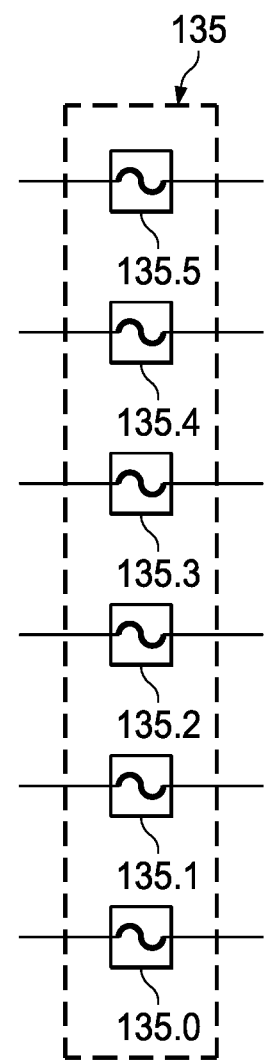

FIG. 1A illustrates a schematic representation of an adjustable resistor network 100 according to various examples. The resistor network 100 includes resistors R1 and R2 connected in series between connection nodes 105 and 110. A resistor ladder 115 is connected to the node 110 and to a node 120 between R1 and R2, and has an effective resistance R3. The resistor R2 may be referred to as a "bypass resistor" as it is connected in parallel with the resistor ladder 115, and therefore a portion of the current between the connection nodes 105 and 110 bypasses the resistor ladder 115. The resistor R1 may be referred to as a "series resistor" as it is connected in series between the connection node 105 and the resistance $R_2 \| R_3$. The resistor ladder 115 includes a number of resistors connected in parallel to a first bus 125 and to a second bus 130. These resistors may sometimes be referred to as "fused resistors". The illustrated resistor ladder 115 includes six fused resistors as one example, with the understanding that any number of fused resistors greater than one may be used. The fused resistors in the resistor ladder are designated R3.0, R3.1, R3.2, R3.3, R3.4 and R3.5, and may be referred to generally as R3.N, where N may be referred to as an index value. Any of the resistors R3.N may be referred to as a "step" in the resistor ladder. A first terminal of each fused resistor R3.N is connected to the bus 125. A fuse bank 135 includes a corresponding fusible links 135.N connected in series between each fused resistor R3.N and the bus 130. The fusible links 135.N may be referred to as "fuses" for brevity. Thus in the current example the fuse bank 135 includes fuses 135.0 through 135.5, as detailed in FIG. 1B. The bus 125 is connected to the node 120 and the bus 130 is connected to the connection node 110. A total resistance between the connection nodes 105 and 110 is computed as $R_{tot}$=R1+R2$\|$R3.5$\|$R3.4$\|$R3.3$\|$R3.2$\|$R3.1$\|$R3.0 when all the fuses 135.N are connected (unblown). As discussed in greater detail below, the resistance $R_{tot}$ may be adjusted, or trimmed, by selectively opening (blowing) one or more of the fuses 135.N. (In this discussion and in the claims, a fused resistor R3.N is regarded as "connected" to the bus 125 even if an intervening fuse is blown.) The resistor network 100 may be considered a single adjustable resistor.

Figure 2:
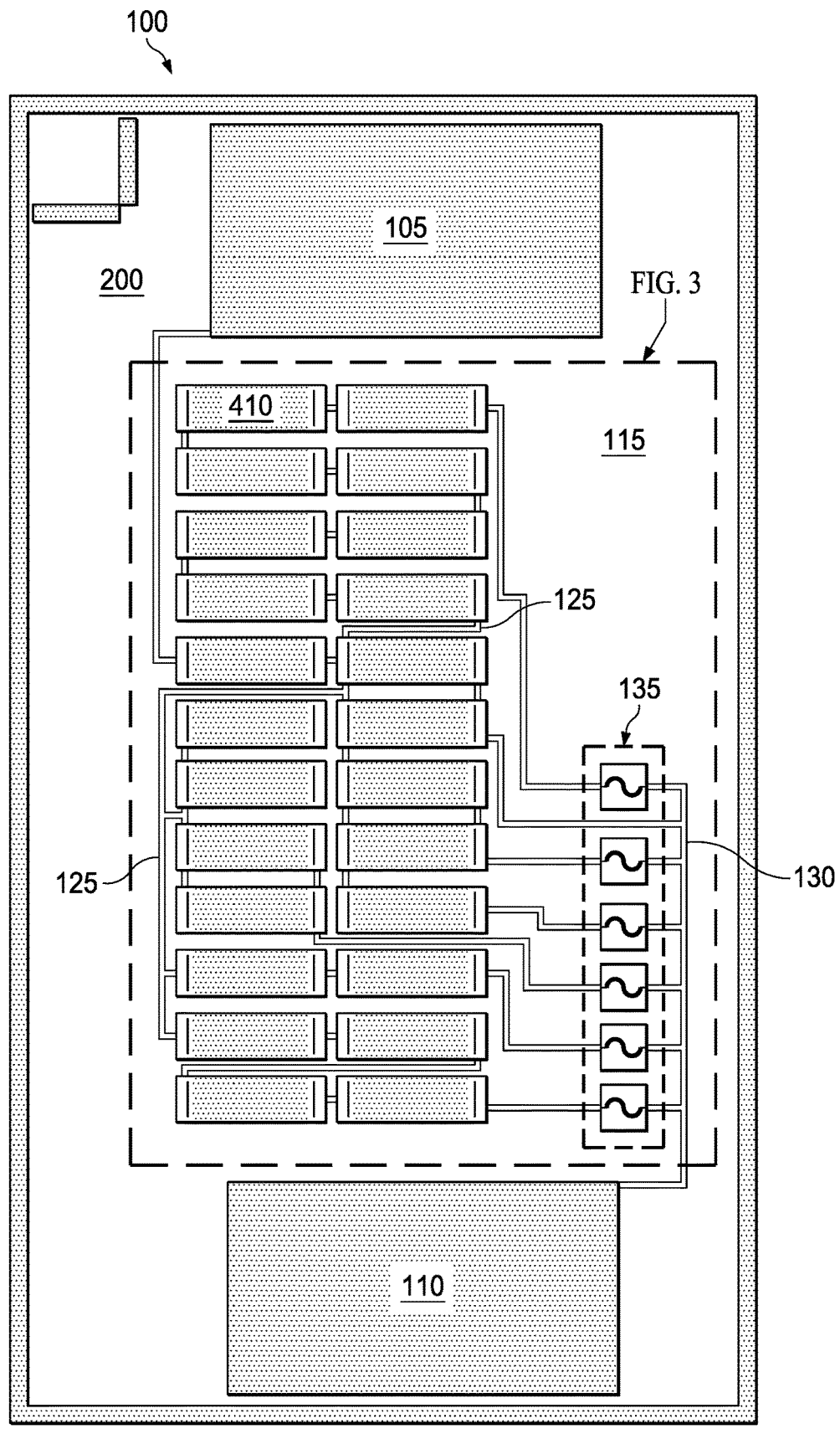
FIG. 2 illustrates a physical layout of the adjustable resistor network of FIG. 1A according to one example as might appear on a semiconductor die.
Figure 3:
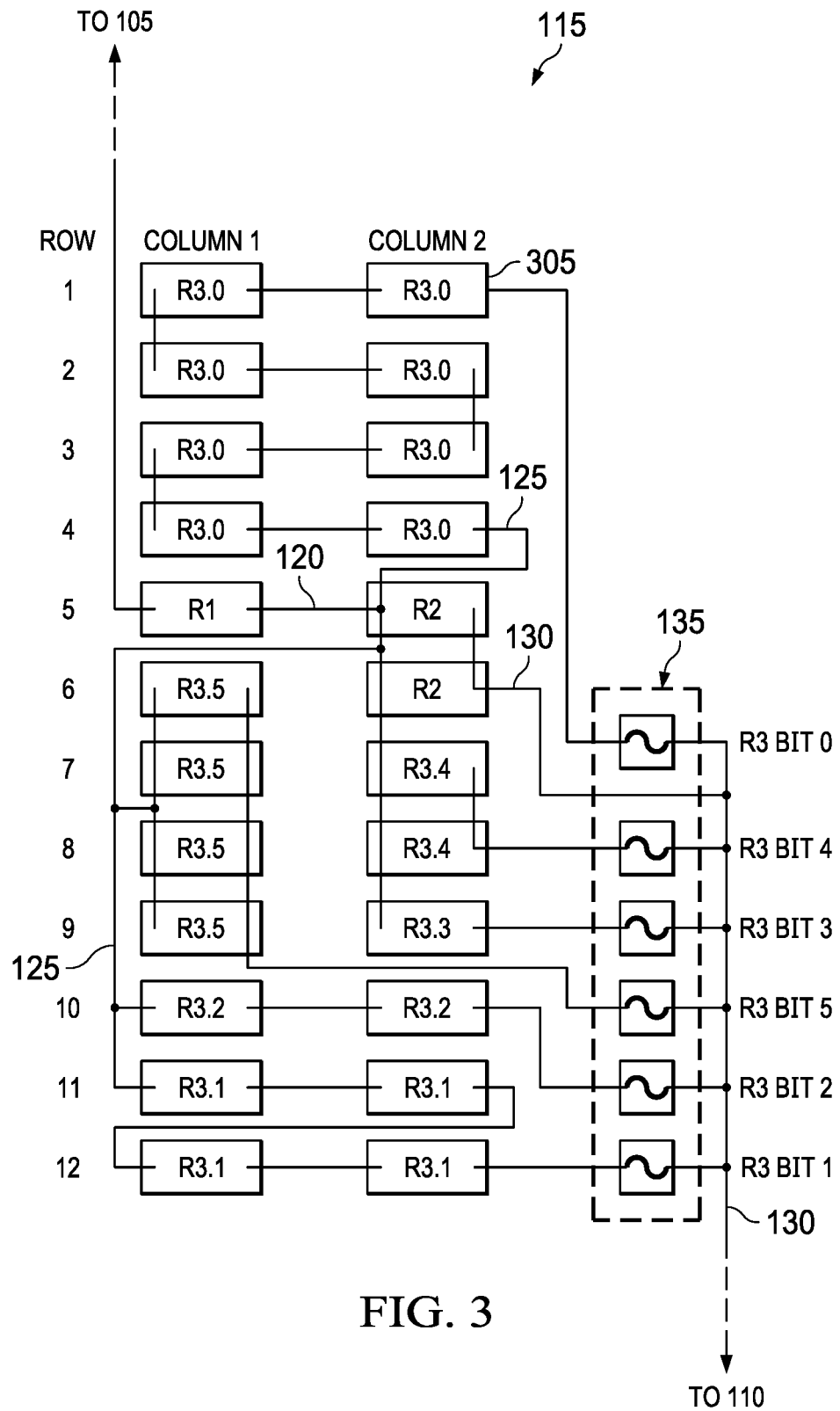
FIG. 3 illustrates a schematic representation of the physical layout of FIG. 2, featuring interconnections between unit resistors in the adjustable resistor network.

FIG. 2 illustrates a physical layout of an adjustable resistor network die 200 corresponding to the schematic representation of the adjustable resistor network 100 according to one example as might appear on a semiconductor substrate. The relative positions of the connection nodes 105 and 110, e.g. wirebond pads, the resistor ladder 115, R1 and R2, and the fuse bank 135 are shown as but one example without implied limitation. The resistor ladder 115 is shown in FIG. 3 in greater detail to facilitate understanding of the various examples. As described further below, R1 and R2 are optionally located within the array to reduce effects of local process variation within the die 200. The resistor ladder 115 is implemented with a number of nominally identical unit resistors, e.g. arranged in an array.

In FIG. 3 the resistor ladder 115 includes a number of unit resistors 305, which may each have a same nominal resistance $R_{unit}$. R1 and R2 are each also implemented with one or more instances of the unit resistor 305. Without implied limitation, the unit resistors 305 are arranged as an array of two columns and 12 rows. In this discussion, an individual unit resistor 305 may be referred to by its column number and row number, e.g. $R_{C,R}$. Some of the fused resistors R3.N of FIG. 1 may be implemented by connecting two or more of the unit resistor 305 in series or in parallel. In some cases the unit resistance $R_{unit}$ may be selected such that one or more of the resistors in the adjustable resistor network 100 may be implemented with a single unit resistor 305.

The unit resistors 305 are labeled according to which resistor in the adjustable resistor network 100 that unit resistor 305 is configured to implement. The resistor R1 is implemented by a single instance of the unit resistor 305, e.g. $R_{1,5}$. The resistor R2 is implemented by two instances of the unit resistor 305 connected in parallel, e.g. $R_{2,5}$ and $R_{2,6}$, and has a resistance of ½ $R_{unit}$. The fused resistor R3.0 is implemented by eight instances of the unit resistor 305 connected in series, e.g. $R_{1,1}$, $R_{1,2}$, $R_{1,3}$, $R_{1,4}$, $R_{2,1}$, $R_{2,2}$, $R_{2,3}$ and $R_{2,4}$, and has a resistance of 8·$R_{unit}$. The fused resistor R3.1 is implemented by four instances of the unit resistor 305 connected in series, e.g. $R_{1,11}$, $R_{1,12}$, $R_{2,11}$ and $R_{2,12}$, and has a resistance of 4·$R_{unit}$. The fused resistor R3.2 is implemented by two instances of the unit resistor 305 connected in series, e.g. $R_{1,10}$ and $R_{2,10}$, and has a resistance of 2·$R_{unit}$. The fused resistor R3.3 is implemented by a single instance of the unit resistor 305, e.g. $R_{2,9}$ and has a resistance of $R_{unit}$. The fused resistor R3.4 is implemented by two instances of the unit resistor 305 connected in parallel, e.g. $R_{2,7}$ and $R_{2,8}$, and has a resistance of ½·$R_{unit}$. And the fused resistor R3.5 is implemented by four instances of the unit resistor 305 connected in parallel, e.g. $R_{1,6}$, $R_{1,7}$, $R_{1,8}$, and $R_{1,9}$, and has a resistance of ¼·$R_{unit}$. Any of the resistors R1, R2 or R3.N implemented with more than a single unit resistor 305 may be referred to as a "composite resistor".

Considered more generally, a particular one of the fused resistors R3.N may have a resistance expressed as 8·$R_{unit}$/$2^N$, where N is the index value of that particular resistor. It can be seen then that the resistor values from R3.0 to R3.5 have an exponential progression, in which each fused resistor R3.N has a resistance equal to twice that of the next lower-valued resistor. This progression may be referred to as a binary progression. In other examples a non-binary progression of resistor values may be used, e.g. integer powers of 3 or 10.

Conveniently, the values N may be viewed as a bit position of a binary value that describes the state of the fuse 135.N associated with each of the fused resistors R3.N. This value may be referred to herein as a "ladder fuse code", sometimes abbreviated LFC. Thus when all the fuses are intact (unblown), the ladder fuse code is $111111_2$, and when all the fuses are blown the ladder fuse code is $000000_2$. This aspect is discussed in greater detail below.

With continued reference to FIG. 3, interconnections between the unit resistors 305 are shown schematically by heavy lines. In a physical implementation of the resistor ladder 115 the interconnections may be in the form of metal traces in an interconnect level of the adjustable resistor network die 200 (FIG. 2). Various feature references are shown that relate back to the schematic representation of FIG. 1, e.g. the first bus 125, the second bus 130 and the node 120. The interconnections determine the assignment of each of the unit resistors 305 to one of the fused resistors R3.N. In the illustrated example, the interconnections are arranged to prevent crossing interconnections, which may be advantageous to allow forming the interconnections in a single metal level. Of course in other examples any other arrangement of interconnections may be used that is consistent with the principles of the disclosure. In the illustrated example, the fuses 135.N are not arranged in bit order as a consequence of other layout constraints. In other examples, a second metal interconnect level may allow the fuses 135.N to be arranged in another order, such as bit order. The bit positions are labeled "R3 Bit 0" through "R3 Bit 5" in the current example, where "R3 Bit 0" represents a logical association of the programmable fuse R3.0 with the value of R3, and similarly for the other fuses.

The value of the resistor ladder 115 may be adjusted, in a process sometimes referred to as trimming, by opening one or more of the fuses 135.X, e.g. by a laser process. The ladder fuse code represents the logical state of the fuses in a binary number, with the MSB (most significant bit) describing fuse 135.5 and the LSB (least significant bit) describing fuse 135.0. The resistor ladder 115 has a minimum value R3 of about ⅛ $R_{unit}$ when the fuse value is $111111_2$ and has a maximum value of 8·$R_{unit}$ when the fuse value of $000001_2$ (or R3=∞ for the trivial case of a fuse value of $000000_2$). Resistance values between these limits may be obtained by an appropriate selection of the fuse value. This aspect is further addressed below.

The use of unit resistor cells during trim helps control the overall variability of the resistor network 100. Variability is further reduced by placing the most (mathematically) significant resistor components (R1, R2, and the most resistive bits of the weighted ladder) in the center of the array in accordance with best resistor matching practices. In addition to the center of the array being more uniform from a processing perspective, it is also further away from any stress produced by proximity to the pads 105, 110. Thus in some examples first and second pluralities of unit resistors may be arranged in a two-dimensional array. The first plurality of unit resistors may be located between a first subset of the second plurality of unit resistors and a second subset of the second plurality of unit resistors.

Figure 4A:
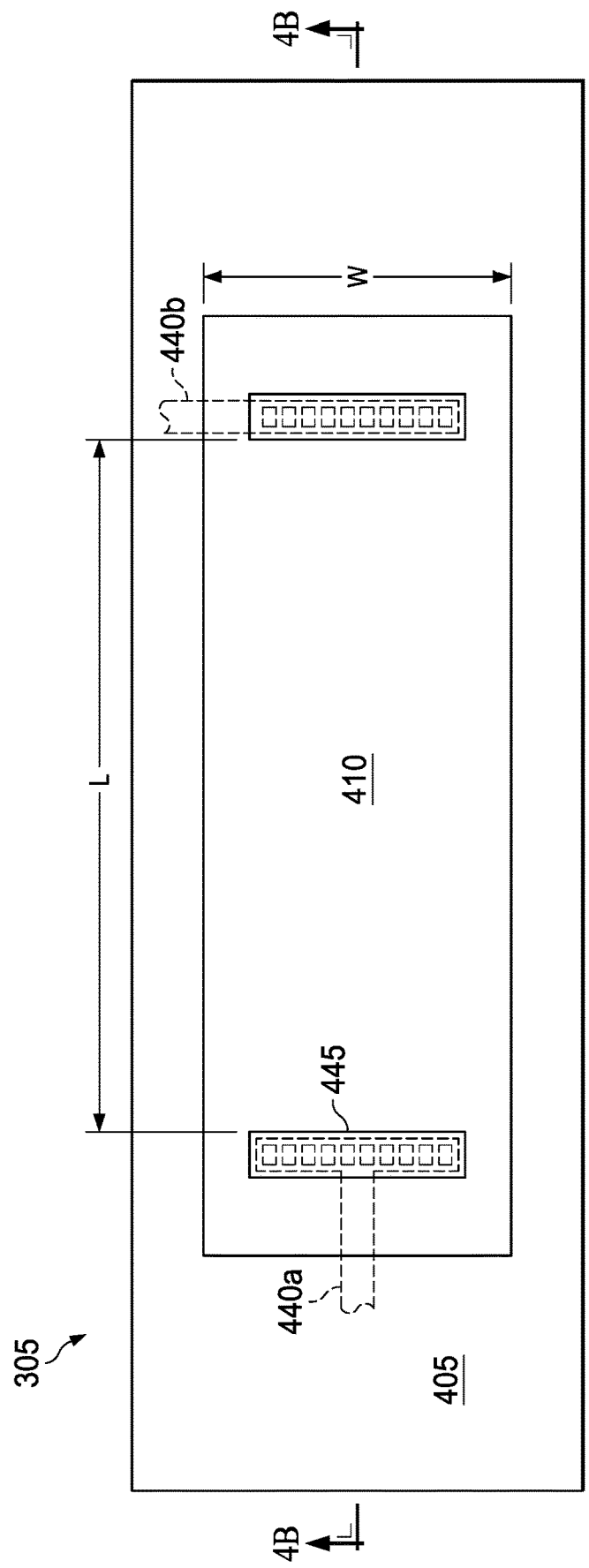

FIGS. 4A-4C illustrate the unit resistor 305 in one example as may be implemented in a semiconductor substrate. FIG. 4A shows the unit resistor 305 in plan view, while FIG. 4B shows a section of the unit resistor 305 taken at the plane marked in FIG. 4A. In this example, the unit resistor 305 is formed in and over a lightly-doped p-type silicon substrate 405. Those skilled in the pertinent art will appreciate that the unit resistor 305 may be implemented in an n-type substrate with appropriate modification of the dopants. A resistive region 410, e.g. a deep n-well (DWELL), is formed by implanting an n-type dopant, e.g. phosphorous, into the substrate 405 to a depth D and a concentration $\rho_n$. A field oxide layer 415, e.g. LOCOS (local oxidation of silicon) or STI (shallow trench isolation), overlies the substrate 405 and the resistive region 410. N+ contact strips 445 are located at opposite ends of the resistive region 410, and an oxide layer 420 may be optionally located on the field oxide layer 415 and substrate 405 outside the resistive region 410. A dielectric layer 425 overlies the field oxide region 415 and the oxide layer 420, if present. Vias 435 (sometimes referred to as contacts) provide a vertical current path from terminals 430 to the contact strips 445, and ohmic connections from the vias 435 to the contact strips 445 may be facilitated by silicide regions 450 (FIG. 4C). Interconnections 440 may run parallel (440a) or perpendicular (440b) to the long axis of the contact strips 445 to provide connections between the multiple unit resistors of the resistor ladder 115, to the bus 125, or to one of the fuses 135.N. Interconnect features of the unit resistor 305 may be implemented in any conventional or future-developed material system. For example, the terminals 430 and interconnections 440 may be implemented in Al by subtractive etch or in Cu by a damascene process and the vias 435 may be implanted by W fill.

A nominal value of the unit resistance of the unit resistor 305 may be determined in significant part by a width W of the n-well, a length L determined by a distance between the n+ contact strips 445, the depth D and the dopant concentration $\rho_n$. In one example, the n-well may be doped with phosphorous with a dose of about $1.68 \times 10^{12}$ with a junction depth D of about 2.5 μm, a length L of about 45.84 μm and a width W of about 17.2 μm. Under these conditions the unit resistance $R_{unit}$ of the unit resistor 305 is expected to be about 8.3 kΩ. Any or all of these parameters may be adjusted in other examples to achieve a different unit resistance as appropriate to a particular implementation. Furthermore, while the unit resistor 305 has been described in the form of a diffused substrate resistor, the described principles may be applied to other types of resistors, e.g. polysilicon resistors.

In various examples the unit resistors 305 may have a resistance that changes in a predictable manner in response to a change of substrate temperature. Resistors with this property are often referred to as thermistors. A resistor network 100 implemented using thermistor unit resistors 305 consistent with the described principles is expected to respond to temperature similar to the temperature dependence of the unit resistors 305. Thus the resistor network 100 may be considered a thermistor with binary (or exponential) weighted trim. While implementations are not limited to thermistors, the trim precision provided by the described principles may be of particular utility in thermistor applications by providing cost-effective large scale production of thermistors with a precise and baseline resistance and tight distribution of baseline resistance. Additional details regarding thermistor formation may be found in U.S. patent application Ser. No. 15/639,492, the content of which is incorporated by reference herein.

Figure 5:
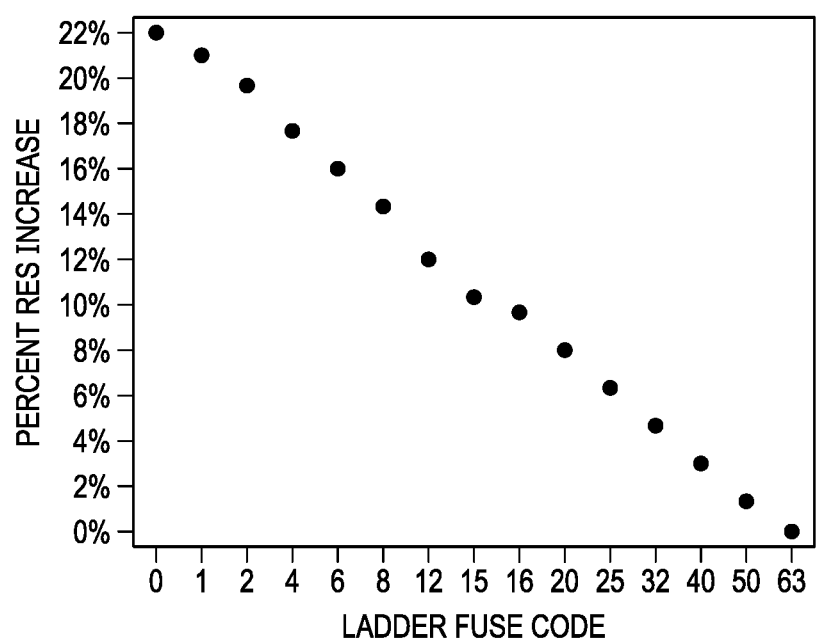
FIG. 5 illustrates one example of percent resistance increase of measured resistance of a plurality of the adjustable resistor network of FIG. 1A as a function of ladder fuse code in a log-linear plot.

Turning to FIG. 5, a percent increase of $R_{tot}$ from a baseline (no fuses blown) value of the resistor network 100 is illustrated as a function of ladder fuse code for 15 unique code values in one example. The vertical axis is linearly scaled, while the horizontal axis is approximately log-scaled. In this particular example, the percent increase of $R_{tot}$ increases from right (higher ladder fuse code) to left (lower ladder fuse code), from 0% to about 22%. In various examples, the resistor network may be designed for a nominal pre-trim value of $R_{tot}$ that is below a nominal post-trim value of $R_{tot}$. The pre-trim value of $R_{tot}$ may be referred to as $R_{NB}$ (NB=none blown). A realized pre-trim value of $R_{tot}$ may be measured for a particular instance of the resistor network 100, and a delta resistance determined to increase $R_{tot}$ from the measured pre-trim value to a nominal post-trim value. The range of resistance increase, e.g. 22% in the example of FIG. 5, determines a lower limit for the pre-trim values that may be accommodated by this methodology, and the nominal post-trim value provides an upper limit, for the pre-trim values that may be accommodated.

Figure 6:
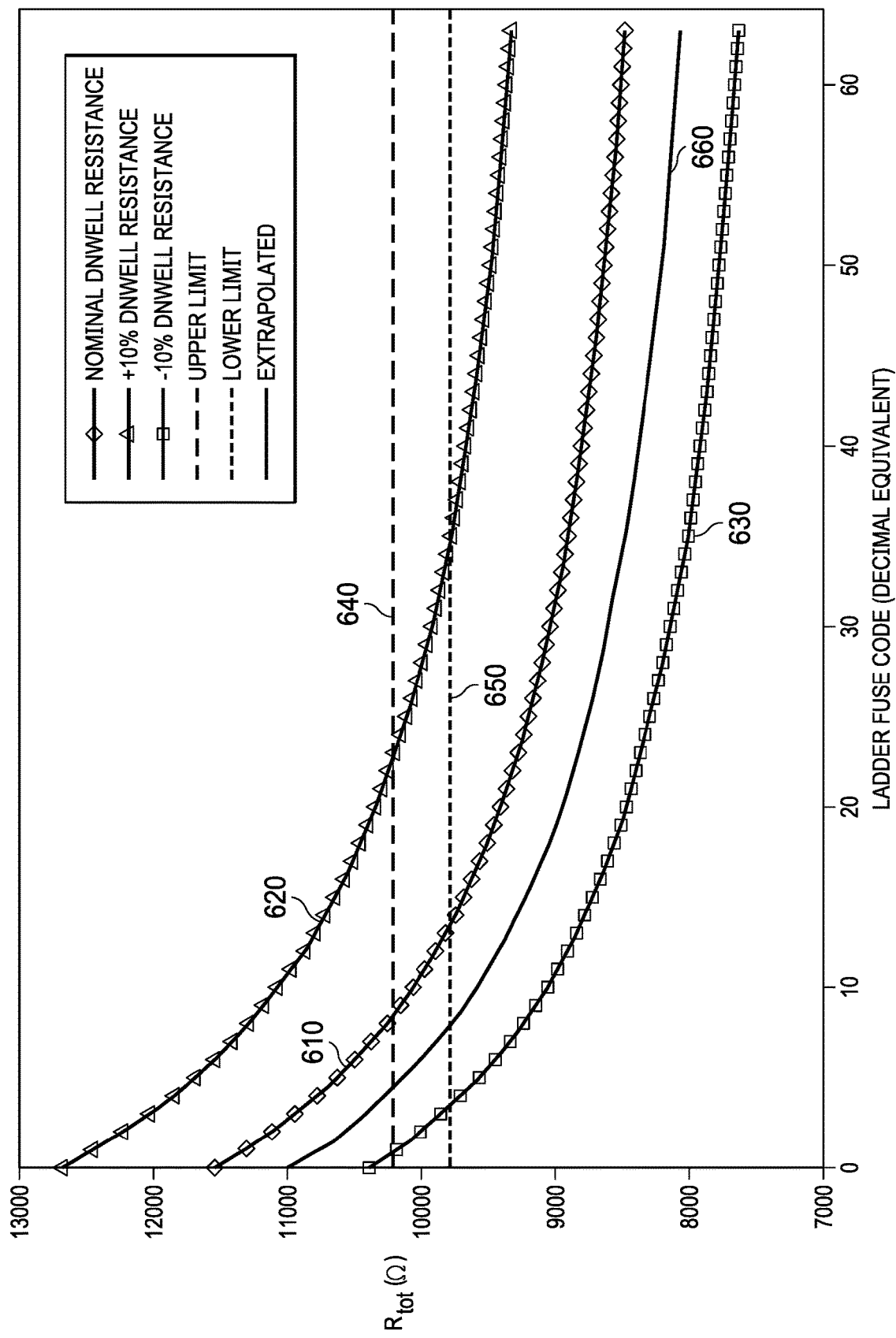
FIG. 6 illustrates absolute resistance of an 11.5 kΩ resistor ladder formed from unit resistors configured such as shown in FIGS. 1A and 3, as a function of ladder fuse code for a nominal case, and for ±10% excursions of the unit resistance from a nominal resistance.

FIG. 6 illustrates three characteristics of computed $R_{tot}$ as a function of increasing ladder fuse code value, from $0_{10}$ to $63_{10}$ with all ladder fuse code values included and presented on a linear-scaled horizontal axis. In a non-limiting example, a nominal post-trim resistance of 10 kΩ is indicated by a horizontal line at that value. In other implementations the nominal post-trim resistance may be a different value, e.g. any value greater than $R_{NB}$ for a particular resistor network design. A nominal characteristic 610 displays $R_{tot}$ for the case that all of the unit resistors 305 are formed with a resistance equal to a nominal resistance of 8.3 k$\Omega$. A +10% characteristic 620 displays $R_{tot}$ for the case that all of the unit resistors 305 are formed with a resistance 10% greater than the nominal resistance. Similarly, a −10% characteristic 630 displays $R_{tot}$ for the case that all of the unit resistors 305 are formed with a resistance 10% less than the nominal resistance. The resistance of the nominal characteristic 610 decreases from about 11.5 k$\Omega$ at a ladder fuse code of $0_{10}$ to about 8.5 k$\Omega$ at a ladder fuse code of $63_{10}$. The resistance of the +10% characteristic 620 decreases from about 12.7 k$\Omega$ at ladder fuse code of $0_m$ to about 9.4 k$\Omega$ at ladder fuse code of $63_{10}$. And the resistance of the −10% characteristic 630 decreases from about 10.4 k$\Omega$ at ladder fuse code of $0_{10}$ to about 7.6 k$\Omega$ at ladder fuse code of $63_{10}$.

The resistance value of each characteristic may be mathematically expressed approximately as $$R_{tot}=R_{NB}(R_{AB}-R_{NB})e^{-\alpha \cdot LFC}, \quad (1)$$

where $R_{AB}$ is the value of $R_{tot}$ with all fuses blown, and a is an empirical coefficient equal to about 0.061 for the illustrated data set.

Considering first the nominal characteristic 610, a particular instance of the resistor network 100 may experience nominal processing conditions and have a resistance $R_{NB}$ of 8.5 k$\Omega$, placing this particular resistor network 100 on the nominal characteristic 610 at the ladder fuse code $63_{10}$. A 17.6% increase of resistance will result in the nominal resistance of 10 k$\Omega$ for this resistor network 100. The nominal characteristic 610 is seen to be about equal to the 10 k$\Omega$ nominal resistance at a ladder fuse code of $10_{10}$. Thus the fuses 135.N may be blown in a pattern of $001010_2$ (e.g. fuses 135.5, 135.4, 135.2 and 135.0 blown) to result in an $R_{tot}$ of 10 k$\Omega$ for this particular resistor network 100. Consider further upper limit 640 and lower limit 650, which may define an allowable tolerance of $R_{tot}$ after programming, e.g. ±200$\Omega$. It is seen that five ladder fuse codes, $9_{10}$-$13_{10}$, result in a programmed $R_{tot}$ in this range. Of course, the tolerance may be determined by technical application, and is not limited to any particular value.

Next considering the +10% characteristic 620, a particular instance of the resistor network 100 with an unblown value $R_{NB}$ of 9.35 k$\Omega$ falls on this characteristic. This resistor network 100 requires only about 7% increase of resistance to equal about 10 k$\Omega$. Inspection shows that a fuse value code of $28_{10}$, or $011100_2$, results in a resistance $R_{tot}$ about equal to 10 k$\Omega$. Thus the fuses 135.5, 135.1 and 135.0 may be blown to achieve this result. Moreover, 13 fuse value codes from $23_{10}$ to $35_{10}$, may result in a value of $R_{tot}$ in a range between 10 k$\Omega$±200$\Omega$.

Finally considering the −10% characteristic 630, a particular instance of the resistor network 100 with an unblown value $R_{NB}$ of 7.6 k$\Omega$ falls on this characteristic. This resistor network 100 requires about 31.6% increase of resistance to equal about 10 k$\Omega$. Inspection shows that a fuse value code of $2_{10}$, or $000010_2$, results in a resistance $R_{tot}$ about equal to 10 k$\Omega$. Thus the fuses 135.5, 135.4, 135.3, 135.2 and 135.0 may be blown to achieve this result. However, in this case only three fuse value codes from $1_{10}$ to $3_{10}$, may result in a value of $R_B$ in a range between 10 k$\Omega$±200$\Omega$ due to the higher slope of the characteristic 630 near the vertical axis.

Now consider an arbitrary instance of the adjustable resistor network 100 that has an initial resistance $R_{tot}=R_{NB}$ between the ±10% limits, represented by the characteristic 660. The value of $R_{NB}$ may be determined by directly measuring the resistance, e.g. by in-line wafer probe. The relationship of Eq. 1 may be computationally translated such that the computed value of $R_{NB}$ equals the measured value. Then ladder code values falling within the tolerance range may be determined. Any such ladder code value may be selected to meet the predetermined tolerance of $R_{tot}$ after blowing the appropriate fuses 135.N, though typically the ladder code value that results in $R_{tot}$ closest to the design value, e.g. 10 k$\Omega$, may be selected.

Figure 7:
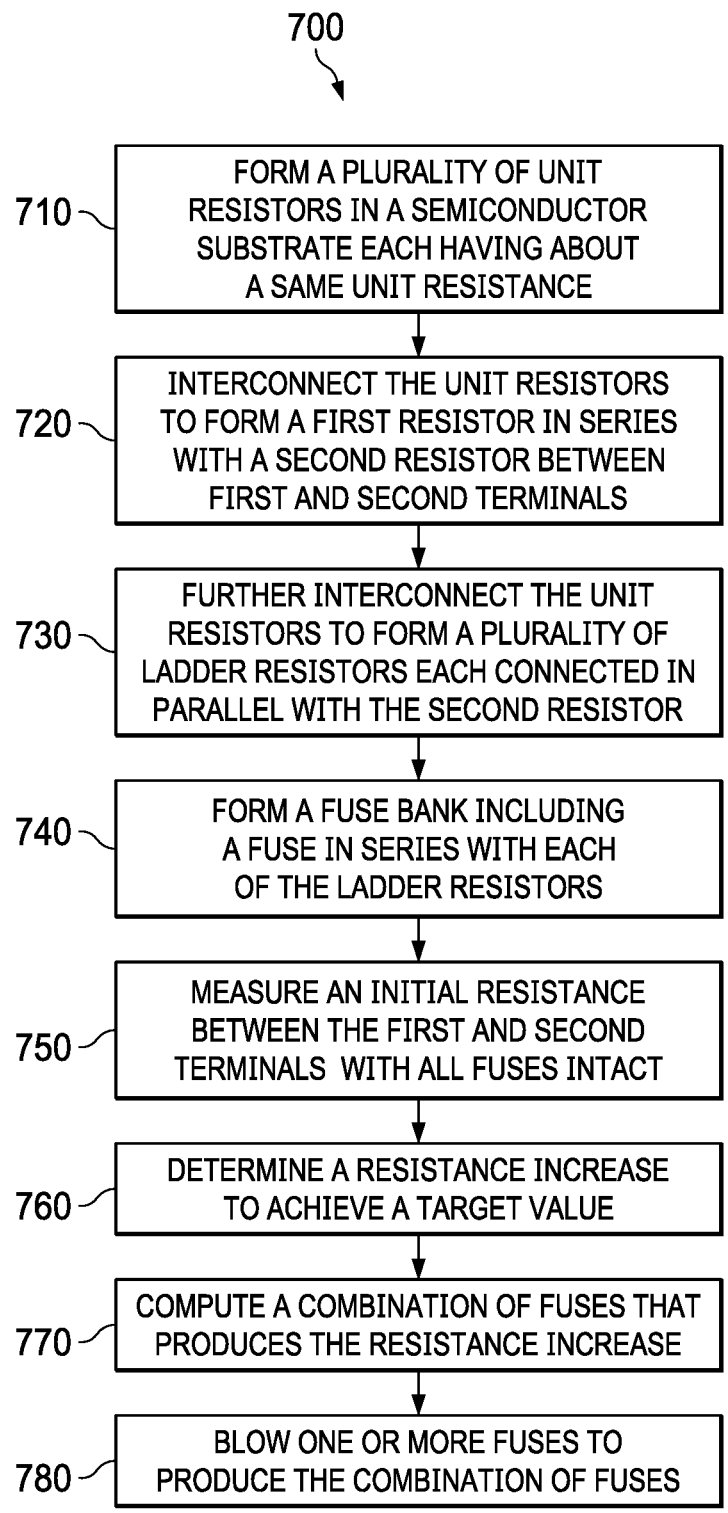
FIG. 7 presents a method of programming an adjustable resistor network to achieve a target resistance.

Turning to FIG. 7, a method 700 is shown, e.g. for forming an integrated circuit, e.g. an adjustable resistor network, to achieve a target resistance. The method 700 is described without implied limitation view of the adjustable resistor network 100. In a step 710 a plurality of unit resistors is formed in a semiconductor substrate, each of the unit resistors having about a same unit resistance. Each of the unit resistors may be an instance of the unit resistor 305. In a step 720 the unit resistors are interconnected to form a first resistor in series with a second resistor between first and second terminals. The first resistor may be the resistor R1 of FIG. 1A, and the second resistor may be the resistor R2 of FIG. 1A. In a step 730 the unit resistors are further interconnected to form a plurality of ladder resistors each connected in parallel with the second resistor. The ladder resistors may be exemplified by the fused resistors R3.N. In a step 740 a fuse bank is formed that includes a fuse in series with each of the ladder resistors. An example of the fuse bank is provided by the fuse bank 135.

In a step 750 the initial resistance $R_{tot,UB}$ of a device under test (DUT) is determined between the first and second terminals with all fuses intact. If $R_{tot,UB}$ is >101% of the target resistance the trim procedure is terminated, since no reduction of resistance is possible by blowing a fuse. If $R_{tot,UB}$ exceeds a device tolerance value, the DUT may be marked for scrap. In a step 760 a resistance increase is determined that when added to the initial resistance results in a target resistance. The resistance increase may be determined in the form of a Percent INcrease to hit Target, or PINT value. The PINT value may be determined as a difference between the target resistance, $R_{target}$, and the measured resistance, $R_{meas}$, divided by $R_{meas}$. If the PINT value exceeds the maximum adjustment range of the DUT, then the trim procedure may be terminated, In a step 770 a combination of fuses is computed that produces the target value, e.g. by computing a fuse code value. In one example the fuse code value may be determined as determined by a polynomial fit using empirical coefficients. In some cases it may be convenient to express a ladder code value in terms of the PINT. In one example, a $5^{th}$-order polynomial fit may be used, e.g.

$$LFC = \text{round}[a + b \cdot PINT + c \cdot PINT^2 + d \cdot PINT^3 + f \cdot PINT^4 + g \cdot PINT^5] \quad (2)$$

where the coefficients a, b, c, d, f and g may be determined empirically from modelled unit resistance values or from measurement of manufactured examples of a particular $R_{tot}$ design value for the adjustable resistor network 100. In one nonlimiting example, the coefficients are shown in Table I for an adjustable resistor network exemplified by adjustable resistor network 100 (e.g. six bits, 10 k$\Omega$ post-trim resistance). In this example, a maximum possible increase of resistance may be about 19.7%. After determining the fuse code value, the value may be directed to a fuse programming system, e.g. a laser fuse blowing tool, for implementation of the desired fuse combination.

While the method is not limited to any particular fitting model, factors that may be relevant include a desired precision of the FSV solution and computation resources available during the trimming process. Thus in some cases a polynomial of lower order may be sufficient to achieve a desired precision, while in other cases a polynomial of higher order may be advantageous. Table I below includes coefficient values for two additional examples, e.g. a six-bit resistor network with a nominal post-trim value of 47 k$\Omega$, and a five-bit resistor network with a nominal post-trim value of 100 k$\Omega$. In the case of the five-bit example, the resistor ladder 115 may be implemented using only five fused resistors with values $\frac{1}{4} \cdot R^{unit}$, $\frac{1}{2} \cdot R^{unit}$, $R^{unit}$, $2 \cdot R^{unit}$ and $4 \cdot R^{unit}$.

TABLE I

| Nominal Posttrim Resistance | 10 k$\Omega$ | 47 k$\Omega$ | 100 k$\Omega$ |
|---|---|---|---|
| $R_{unit}$ (k$\Omega$) | 8.3 | 38.5 | 81.0 |
| Width ($\mu$m) | 17.2 | 7.2 | 7.0 |
| Length ($\mu$m) | 45.84 | 74.47 | 153.38 |
| No of bits | 6 | 6 | 5 |
| Fuse code range | 0-63$_{10}$ | 0-63$_{10}$ | 0-31$_{10}$ |
| Max % Resistance increase | 19.74% | 19.76% | 19.77% |
| a | 62.84531 | 62.84531 | 30.99155 |
| b | −988.558 | −988.558 | −429.921 |
| c | 9301.928 | 9301.928 | 3157.283 |
| d | −58702.5 | −58702.5 | −18637.8 |
| f | 204317.3 | 204317.3 | 69980.34 |
| g | −289378 | −289378 | −116477 |

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An electronic device, comprising:
a semiconductor substrate;
a plurality of fused resistors having resistance values that form an exponential progression, each fused resistor including one or more doped resistive regions formed in the substrate, a first terminal of each of the fused resistors connected to a first terminal of a corresponding one of a plurality of fusible links; and
first and second interconnection buses located over the substrate, the first interconnection bus connected to a second terminal of each of the fused resistors, and the second interconnection bus connected to a second terminal of each of the fusible links.

2. The electronic device of claim 1, wherein each fused resistor has a resistance value that is twice a resistance of another fused resistor of the plurality of fused resistors, or has a resistance value that is one-half a resistance of another fused resistor of the plurality of fused resistors.

3. The electronic device of claim 1, further comprising a bypass resistor having a first terminal connected to the first interconnection bus and a second terminal connected to the second interconnection bus.

4. The electronic device of claim 1, further comprising a series resistor having a first terminal connected to the first interconnection bus and a second terminal connected to a connection node.

5. The electronic device of claim 4, wherein the connection node is a first connection node, and further comprising a second connection node connected to the second interconnection bus.

6. The electronic device of claim 1, wherein each of the plurality of fused resistors includes one or more instances of a unit resistor.

7. The electronic device of claim 6, wherein a first fused resistor includes N unit resistors connected in series and a second fused resistor includes N unit resistor connected in parallel.

8. The electronic device of claim 7, wherein a third fused resistor includes no more than one unit resistor.

9. The electronic device of claim 6, further comprising a bypass resistor having a plurality of unit resistors connected in parallel, a first terminal of the bypass resistor connected to the first interconnection bus and a second terminal of the bypass resistor connected to the second interconnection bus and to a connection node.

10. The electronic device of claim 1, wherein the exponential progression includes resistance values of the fused resistors that increase by integer powers of two.

11. An electronic device, comprising:
a semiconductor substrate; and
a first plurality of unit resistors, and a second plurality of unit resistors, each unit resistor formed in or over the semiconductor substrate,
wherein the first plurality of unit resistors are interconnected between a first node and a second node, and a first unit resistor and a second unit resistor of the first plurality of unit resistors are connected at a third node,
wherein the second plurality of unit resistors are each connected between the second node and the third node, and
wherein the first and second pluralities of unit resistors are arranged in a two-dimensional array, with the first plurality of unit resistors located between a first subset of the second plurality of unit resistors and a second subset of the second plurality of unit resistors.

12. The electronic device of claim 11, wherein the unit resistors of the second plurality of unit resistors are arranged as a series of steps of a resistor ladder in which a resistance of each of the steps increases exponentially with respect to a next-lower step.

13. The electronic device of claim 12, further comprising a plurality of fusible links, each of the fusible links being connected in series with a corresponding one of the steps of the resistor ladder.

14. The electronic device of claim 11, wherein each of the unit resistors is a thermistor.

15. The electronic device of claim 11, wherein at least two of the unit resistors of the first plurality of unit resistors are connected between the second node and the third node.

16. The electronic device of claim 11, wherein the unit resistors are interconnected by a single metal level.

17. An electronic device, comprising:
a semiconductor substrate;
a plurality of fused resistors each including one or more instances of a unit resistor and having resistance values that form an exponential progression, each fused resistor including one or more doped resistive regions formed in the substrate, a first terminal of each of the fused resistors connected to a first terminal of a corresponding one of a plurality of fusible links;

first and second interconnection buses located over the substrate, the first interconnection bus connected to a second terminal of each of the fused resistors, and the second interconnection bus connected to a second terminal of each of the fusible links; and a bypass resistor having a plurality of unit resistors connected in parallel, a first terminal of the bypass resistor connected to the first interconnection bus and a second terminal of the bypass resistor connected to the second interconnection bus and to a connection node.

18. The electronic device of claim 17, wherein each fused resistor has a resistance value that is twice a resistance of another fused resistor of the plurality of fused resistors, or has a resistance value that is one-half a resistance of another fused resistor of the plurality of fused resistors.

19. The electronic device of claim 17, further comprising a series resistor having a first terminal connected to the first interconnection bus and a second terminal connected to the connection node.

20. The electronic device of claim 17, wherein the connection node is a first connection node, and further comprising a second connection node connected to the second interconnection bus.

21. The electronic device of claim 17, wherein the exponential progression includes resistance values of the fused resistors that increase by integer powers of two.

22. An electronic device, comprising:
a semiconductor substrate;
a plurality of fused resistors each including one or more instances of a unit resistor and having resistance values that form an exponential progression, a first fused resistor including N unit resistors connected in series and a second fused resistor including N unit resistor connected in parallel, each fused resistor including one or more doped resistive regions formed in the substrate, a first terminal of each of the fused resistors connected to a first terminal of a corresponding one of a plurality of fusible links; and first and second interconnection buses located over the substrate, the first interconnection bus connected to a second terminal of each of the fused resistors, and the second interconnection bus connected to a second terminal of each of the fusible links.

23. The electronic device of claim 22, wherein each fused resistor has a resistance value that is twice a resistance of another fused resistor of the plurality of fused resistors, or has a resistance value that is one-half a resistance of another fused resistor of the plurality of fused resistors.

24. The electronic device of claim 22, further comprising a series resistor having a first terminal connected to the first interconnection bus and a second terminal connected to a connection node.

25. The electronic device of claim 24, wherein the connection node is a first connection node, and further comprising a second connection node connected to the second interconnection bus.

26. The electronic device of claim 22, wherein the exponential progression includes resistance values of the fused resistors that increase by integer powers of two.

* * * * *